(12) United States Patent
Chida et al.

(10) Patent No.: US 12,108,554 B2
(45) Date of Patent: Oct. 1, 2024

(54) FIXING STRUCTURE OF ELECTRONIC COMPONENT AND IN-VEHICLE CHARGER

(71) Applicant: YAZAKI CORPORATION, Tokyo (JP)

(72) Inventors: Chiaki Chida, Susono (JP); Kentaro Imoto, Susono (JP)

(73) Assignee: YAZAKI CORPORATION, Tokyo (JP)

( * ) Notice: Subject to any disclaimer, the term of this patent is extended or adjusted under 35 U.S.C. 154(b) by 205 days.

(21) Appl. No.: 17/898,961

(22) Filed: Aug. 30, 2022

(65) Prior Publication Data

US 2023/0062109 A1 Mar. 2, 2023

(30) Foreign Application Priority Data

Sep. 1, 2021 (JP) ................................. 2021-142158

(51) Int. Cl.
*H05K 7/12* (2006.01)
*H05K 7/20* (2006.01)

(52) U.S. Cl.
CPC ............. *H05K 7/12* (2013.01); *H05K 7/2039* (2013.01)

(58) Field of Classification Search
CPC ....... H05K 7/12; H05K 7/2039; H05K 7/2049
See application file for complete search history.

(56) References Cited

U.S. PATENT DOCUMENTS

| | | | | |
|---|---|---|---|---|
| 5,327,324 A * | 7/1994 | Roth | .................. | H05K 7/20854 174/16.3 |
| 5,466,970 A * | 11/1995 | Smithers | ............. | H01L 23/4093 257/718 |
| 5,844,312 A * | 12/1998 | Hinshaw | ............. | H01L 23/4093 257/722 |
| 6,266,244 B1 * | 7/2001 | Guthrie | .................. | H01L 23/40 257/713 |
| 6,307,155 B1 * | 10/2001 | Permuy | .................... | H05K 7/12 257/727 |
| 7,715,196 B2 * | 5/2010 | Chen | .................... | H01L 23/4093 165/185 |

(Continued)

FOREIGN PATENT DOCUMENTS

| | | |
|---|---|---|
| JP | 2016-167425 A | 9/2016 |
| JP | 2017-108121 A | 6/2017 |
| WO | 2021/057950 A1 | 4/2021 |

*Primary Examiner* — Sagar Shrestha
(74) *Attorney, Agent, or Firm* — Sughrue Mion, PLLC

(57) ABSTRACT

A fixing structure of an electronic component includes a fixing member configured to fix an electronic component while pressing the electronic component against a wall surface of a housing in a pressing direction; and a fastened portion which is provided at a position away from the wall surface of the housing and to which the fixing member is fastened and fixed. The fixing member includes a fixing portion that is fastened and fixed to the fastened portion, a pressing portion that extends from the fixing portion toward the electronic component and is configured to press the electronic component against the wall surface in the pressing direction, and an engaging portion which is provided at the fixing portion. The fastened portion includes an engaged portion that is engaged with the engaging portion, and is configured to limit movement of the fixing portion in a direction opposite to the pressing direction.

4 Claims, 5 Drawing Sheets

(56) References Cited

U.S. PATENT DOCUMENTS

| | | | | |
|---|---|---|---|---|
| 8,893,770 B2* | 11/2014 | Gamborg | ............ | H01L 23/4093 |
| | | | | 361/708 |
| 10,939,591 B2* | 3/2021 | Jang | .................... | H01L 23/4093 |
| 11,043,443 B2* | 6/2021 | Kobayashi | ............ | H05K 7/2039 |
| 11,558,967 B2* | 1/2023 | Ookado | ................. | H05K 7/209 |
| 2004/0031586 A1* | 2/2004 | Rearick | ............... | H01L 23/4093 |
| | | | | 165/185 |
| 2005/0264998 A1* | 12/2005 | McCutcheon | ...... | H01L 23/4006 |
| | | | | 257/E23.084 |
| 2015/0145469 A1 | 5/2015 | You et al. | | |
| 2015/0230362 A1* | 8/2015 | Kobayashi | ........... | H05K 7/2049 |
| | | | | 361/709 |
| 2016/0057891 A1* | 2/2016 | Chang | ..................... | B23P 15/26 |
| | | | | 29/890.03 |
| 2018/0343775 A1* | 11/2018 | Huang | .................... | H01L 25/18 |
| 2018/0376613 A1* | 12/2018 | Chida | .................... | F16B 2/065 |
| 2021/0059041 A1 | 2/2021 | Holderbach et al. | | |
| 2022/0181233 A1* | 6/2022 | Fukuchi | ............. | H01L 23/4006 |

* cited by examiner

FIXING STRUCTURE OF ELECTRONIC COMPONENT AND IN-VEHICLE CHARGER

CROSS-REFERENCE TO RELATED APPLICATIONS

This application is based on and claims priority under 35 USC 119 from Japanese Patent Application No. 2021-142158 filed on Sep. 1, 2021, the contents of which are incorporated herein by reference.

TECHNICAL FIELD

The present disclosure relates to a fixing structure of an electronic component and an in-vehicle charger.

BACKGROUND ART

As a fixing structure of an electronic component, it is known that a plurality of arranged heat-generating electronic components are sandwiched between a heat-dissipation element and an elastic clip, so that the plurality of heat-generating electronic components and the heat-dissipation element are closely bonded to each other as disclosed, for example, in JP2017-108121A and JP2016-167425A. JP2017-108121A describes a structure in which by tightening the elastic clip to the heat-dissipation element with a screw between the heat-generating electronic component and the heat-generating electronic component, the plurality of heat-generating electronic components are pressed against the heat-dissipation element. JP2017-108121A and JP2016-167425A describe a structure in which by tightening the elastic clip to the heat-dissipation element with the screw in lower sides of the plurality of heat-generating electronic components, the plurality of heat-generating electronic components are pressed against the heat-dissipation element.

In the structure in which the elastic clip is fastened to the heat-dissipation element with the screw between the heat-generating electronic component and the heat-generating electronic component, it is necessary to provide a space for the screw, a fastened portion, or the like between the heat-generating electronic component and the heat-generating electronic component, and thus a dimension in a pitch direction (arrangement direction of the plurality of heat-generating electronic components) of an installation space for the plurality of heat-generating electronic components becomes large. In addition, a tightening force of a bolt changes depending on a tightening margin of the screw.

In the structure in which the elastic clip is fastened to the heat-dissipation element with the screw in the lower sides of the heat-generating electronic components, it is necessary to provide a space for the screw, a fastened portion, or the like in the lower side of the heat-generating electronic component, and thus a dimension in a height direction of the installation space for the plurality of heat-generating electronic components becomes large.

SUMMARY OF INVENTION

The present disclosure provides a fixing structure of an electronic component which can reliably fix the electronic component to a wall surface of a housing and can prevent an increase in a dimension of an installation space for the electronic component in the wall surface of the housing, and to provide an in-vehicle charger.

A fixing structure of an electronic component includes a fixing member configured to fix at least one electronic component while pressing the at least one electronic component against a wall surface of a housing in a pressing direction, and a fastened portion which is provided at a position away from the wall surface of the housing and to which the fixing member is fastened and fixed. The fixing member includes a fixing portion that is fastened and fixed to the fastened portion in a fastening direction that intersects the pressing direction, at least one pressing portion that extends from the fixing portion toward the at least one electronic component, the at least one pressing portion being configured to press the at least one electronic component against the wall surface in the pressing direction, and at least one engaging portion which is provided at the fixing portion. The fastened portion includes at least one engaged portion that is engaged with the at least one engaging portion, the at least one engaged portion being configured, in cooperation with the at least one engaging portion, to limit movement of the fixing portion in a direction opposite to the pressing direction.

An in-vehicle charger includes a housing, an electronic component that is fixed to a wall surface of the housing, a fixing member that fixes the electronic component while pressing the electronic component against the wall surface in a pressing direction, and a fastened portion which is provided at a position away from the wall surface of the housing and to which the fixing member is fastened and fixed. The fixing member includes a fixing portion that is fastened and fixed to the fastened portion in a fastening direction that intersects the pressing direction, a pressing portion that extends from the fixing portion to the electronic component and presses the electronic component against the wall surface in the pressing direction, and an engaging portion which is provided at the fixing portion. The fastened portion includes an engaged portion that is engaged with the engaging portion, the engaged portion being configured, in cooperation with the engaging portion, to limit movement of the fixing portion in a direction opposite to the pressing direction.

DESCRIPTION OF EMBODIMENTS

Hereinafter, the present disclosure will be described according to preferred embodiments. The present disclosure is not limited to the embodiments to be described below, and can be changed as appropriate without departing from the gist of the present disclosure. In the embodiments to be described below, some configurations are not illustrated or described, but a known or well-known technique is applied as appropriate to details of an omitted technique within a range where no contradiction occurs to contents to be described below.

Figure 1:
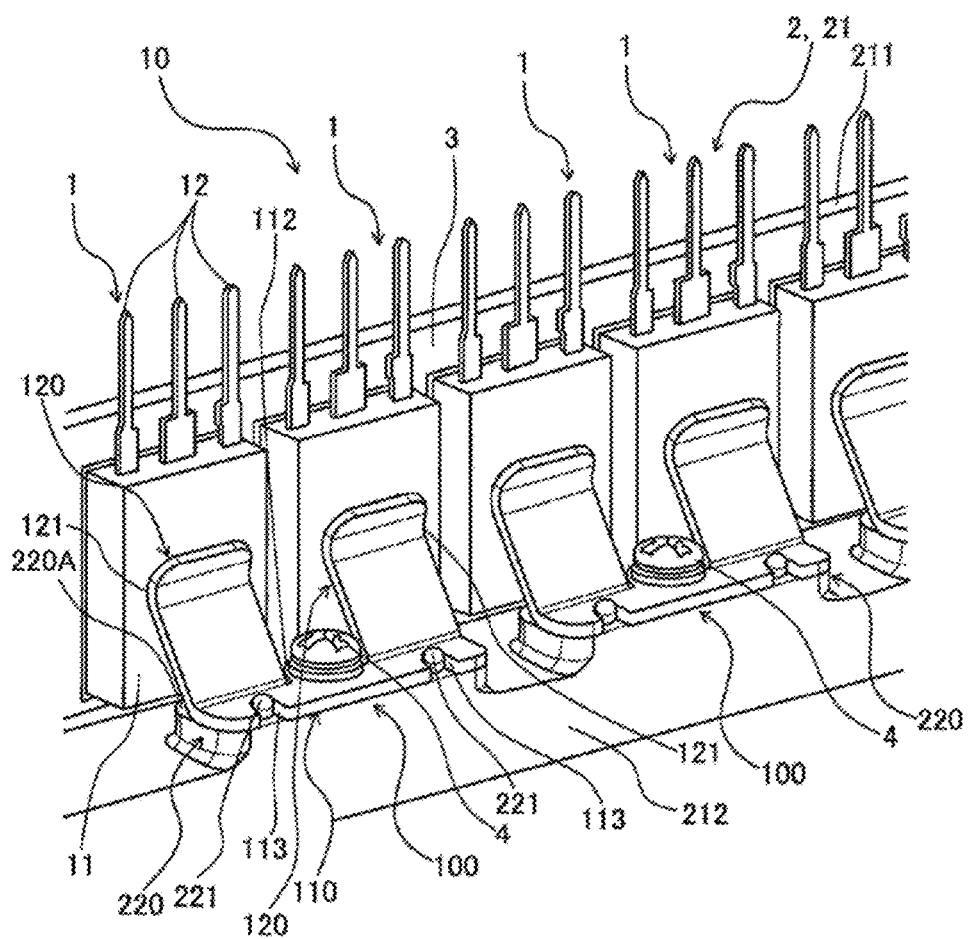
FIG. 1 is a perspective view showing a fixing structure of electronic components according to an embodiment of the present disclosure.

FIG. 1 is a perspective view showing a fixing structure 10 of electronic components 1 according to an embodiment of the present disclosure. The fixing structure 10 shown in FIG. 1 fixes the electronic components 1 attached to a wall surface 211 of a housing 21 of an in-vehicle charger 2. The fixing structure 10 includes fixing members 100 and bases 220 to which the fixing members 100 are fastened and fixed.

The electronic component 1 is an electronic component that self-heats when energized, and is, for example, a field effect transistor (FET) or a discrete component. The electronic component 1 includes a thin rectangular parallelepiped main body portion 11 which is a heat-generating portion, and a plurality of lead wires 12. The plurality of lead wires 12 are connected to a circuit board (not shown).

A heat-dissipation sheet 3 is attached to the wall surface 211 of the housing 21 for heat dissipation and insulation of the electronic component 1. The electronic component 1 is fixed in a state of being pressed against the wall surface 211 of the housing 21 via the heat-dissipation sheet 3 by the fixing member 1M. Further, a cooling water channel (not shown) is provided on the wall surface 211 of the housing 21 to promote the heat dissipation of the electronic component 1.

In the present embodiment, the plurality of electronic components 1 are arranged at equal intervals along a left-right direction (direction orthogonal to a height direction) of the wall surface 211 of the housing 21. Here, a distance between the electronic component 1 and the electronic component 1 is set so narrow that a screw and a bolt cannot be inserted. In each electronic component 1, one surface (heat-dissipation surface) of the main body portion 11 is in surface contact with the heat-dissipation sheet 3, and the lead wires 12 are arranged so as to extend upward from the main body portion 11.

A flange 212 projects laterally from the wall surface 211 of the housing 21, and the plurality of bases 220 are provided on an upper surface of the flange 212. The plurality of bases 220 are arranged at equal intervals along an arrangement direction of the plurality of electronic components 1. Each base 220 includes a rectangular upper surface 220A whose longitudinal direction is the arrangement direction of the plurality of electronic components 1. Here, each of the plurality of bases 220 is provided corresponding to the two electronic components 1.

Figure 2:
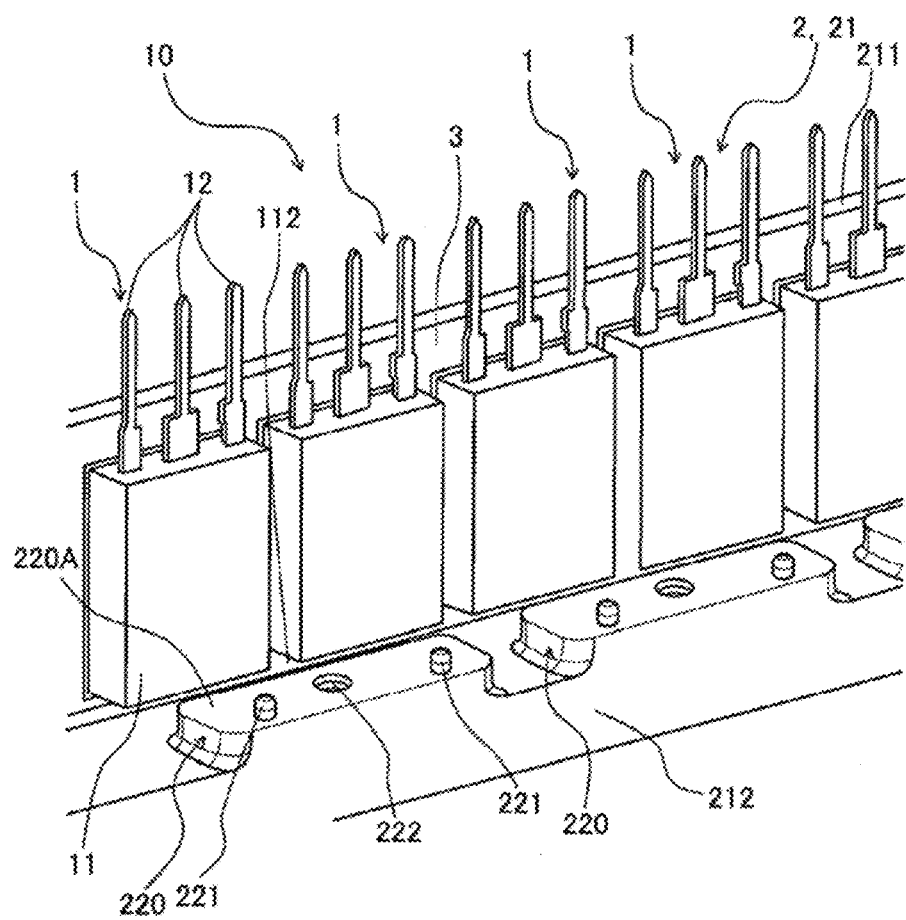
FIG. 2 is a perspective view showing the fixing structure of FIG. 1 with a fixing member not shown.

FIG. 2 is a perspective view showing the fixing structure 10 of FIG. 1 with the fixing member 100 not shown. As shown in FIGS. 1 and 2, the base 220 extends parallel to lower end portions of the two electronic components 1 in the vicinity of the lower end portions (each end portion on an opposite side of the lead wires 12 side). The fixing member 100 is fastened and fixed to the upper surface 220A of the base 220 by a screw 4. A pair of bosses 221 are formed on the upper surface 220A of the base 220, and a screw hole 222 is formed in a central portion of the base 220 in the longitudinal direction.

Figure 3:
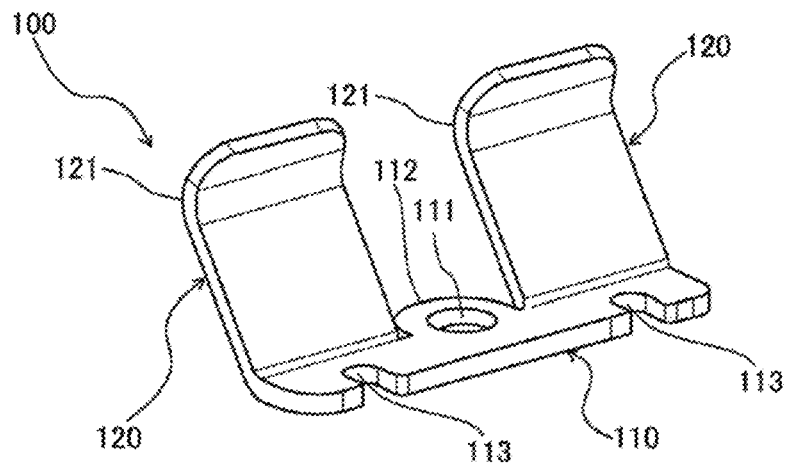
FIG. 3 is a perspective view showing the fixing member of the fixing structure of FIG. 1.

FIG. 3 is a perspective view showing the fixing member 100 of the fixing structure 10 of FIG. 1. As shown in FIGS. 1 and 3, the fixing member 100 includes a fixing portion 110 and a pair of pressing portions 120. The fixing portion 110 is formed in a shape of a rectangular plate whose longitudinal direction is the arrangement direction of the electronic components 1. An insertion hole 111 for the screw 4 is formed in a central portion of the fixing portion 110 in the longitudinal direction. The fixing portion 110 is fastened and fixed to the upper surface 220A of the base 220 by screwing the screw 4 inserted into the insertion hole 111 into the screw hole 222 (see FIG. 2).

A semicircular shape of a fastened portion 112 is formed at the central portion of the fixing portion 110 in the longitudinal direction. The fastened portion 112 is formed so as to project toward an electronic component 1 side at the central portion in the longitudinal direction and one end portion in a width direction (end portion on the electronic component 1 side) of the fixing portion 110. A center of curvature of the fastened portion 112 coincides with a center of the screw hole 222.

A pair of U-shaped grooves 113 are formed at the other end portion (end portion opposite to the electronic component 1 side) of the fixing portion 110 in the width direction. The pair of grooves 113 are provided in one end side and the other end side in the longitudinal direction of the fixing portion 110. Centers of curvature in deep portions of the pair of grooves 113 are provided in the central portion of the fixing portion 110 in the width direction.

Figure 4:
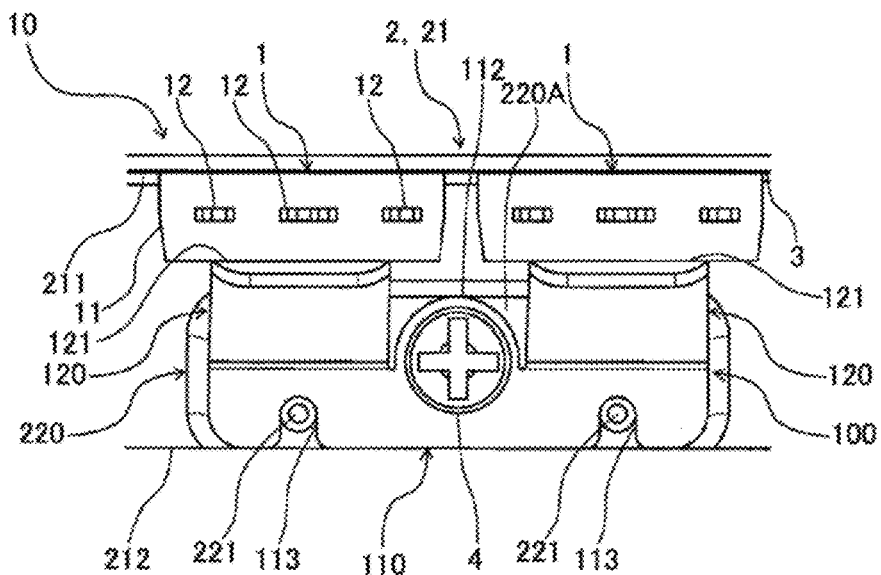
FIG. 4 is a plan view showing the fixing structure of FIG. 1.

FIG. 4 is a plan view showing the fixing structure 10 of FIG. 1. As shown in FIGS. 1 and 4, the pair of bosses 221 are provided on one end side and the other end side of the upper surface 220A of the base 220 in the longitudinal direction. The pair of bosses 221 are provided corresponding to the pair of grooves 113, and a center position of each boss 221 coincides with a position of the center of curvature in the deep portion of each groove 113, and each boss 221 engages with the deep portion of the groove 113.

The pair of pressing portions 120 are leaf springs. The pair of pressing portions 120 are arranged side by side in the arrangement direction of the electronic components 1. The fastened portion 112 is provided between the pair of pressing portions 120. Each pressing portion 120 is arranged so as to face each electronic component 1.

Each of the pair of pressing portions 120 stands up in a state of being inclined toward the electronic component 1 side from one end portion (end portion on the electronic component 1 side) of the fixing portion 110 in the width direction. A tip end side of the pressing portion 120 is refracted to a side away from the electronic component 1, and a refracting portion 121 of the pressing portion 120 is in contact with a central portion of the main body portion 11 of the electronic component 1. Accordingly, an elastic force of the pressing portion 120, which is the leaf spring, acts as a force for pressing the electronic component 1 against the wall surface 211 of the housing 21, and the electronic component 1 is fixed in a state of being pressed against the wall surface 211 by the pressing portion 120.

Figure 5:
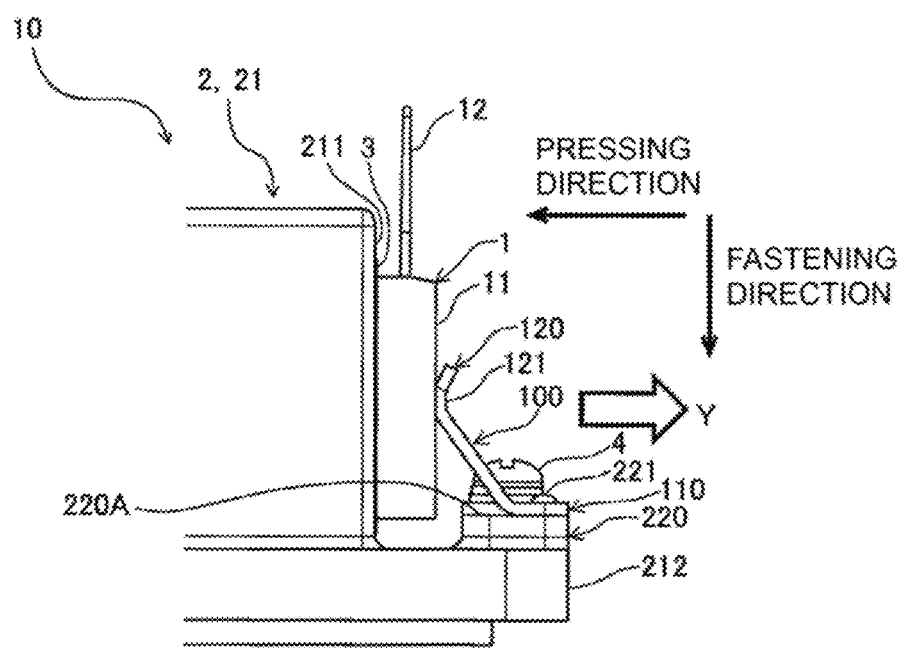
FIG. 5 is a side view showing the fixing structure of FIG. 1.

FIG. 5 is a side view showing the fixing structure 10 of FIG. 1. As shown in FIG. 5, in the fixing structure 10, a pressing force acts on the electronic component 1 and the wall surface 211 from the pressing portion 120, whereas a reaction force Y with respect to the pressing force acts on the fixing portion 110 via the pressing portion 120. The reaction force Y acts in a direction orthogonal to a fastening direction of the screw 4, but by engaging the pair of bosses 221 and the pair of grooves 113 as shown in FIG. 1, movement of the fixing portion 110 due to the reaction force Y in a direction opposite to the pressing direction is limited. Rotation of the fixing portion 110 fastened and fixed to the upper surface 220A of the base 220 around the screw 4 is limited by the pair of bosses 221 and the pair of grooves 113.

Here, a comparative example in which the fixing portion 110 is fastened and fixed to the wall surface 211 by the screw 4 as in the above prior art will be examined. In the comparative example, a screw hole must be formed around the electronic component 1 in the wall surface 211 to fasten and fix the fixing portion 110, and an area of the wall surface 211 is expanded by a space for mounting the fixing portion 110. When the fixing portion 110 is mounted at the lower side of the electronic component 1 in the wall surface 211, a height dimension of the wall surface 211 is increased, and the housing 21 is enlarged in the height direction. Meanwhile, when the fixing portion 110 is mounted between the electronic component 1 and the electronic component 1 in the wall surface 211, a dimension of the wall surface 211 in a lateral direction (arrangement direction of the electronic components 1) is expanded, and the housing 21 is enlarged in the lateral direction.

Meanwhile, in the fixing structure 10 of the electronic components 1 of the present embodiment, the fixing portion 110 of the fixing member 100 is fastened and fixed to the base 220 provided at a position separated from the wall surface 211 in the direction opposite to the pressing direction. The fixing portion 110 is fastened and fixed to the base 220 by the screw 4 in the fastening direction intersecting the pressing direction. Accordingly, the space for mounting the fixing portion 110 can be eliminated from the lower side of the electronic component 1 in the wall surface 211 or between the electronic component 1 and the electronic component 1. Therefore, as compared with the above comparative example, the height dimension and the dimension in the lateral direction of the wall surface 211 can be suppressed, and the housing 21 can be prevented from being enlarged in the height direction and the lateral direction.

In addition, in the fixing structure 10 of the electronic component 1 of the present embodiment, cooperation between the grooves 113 provided in the fixing portion 110 and the bosses 221 provided in the base 220 can limit the movement of the fixing portion 110 by the reaction force Y in the direction opposite to the pressing direction. Therefore, the electronic component 1 can be reliably fixed in the state of being pressed against the wall surface 211 by the fixing member 100, and a heat dissipation effect of the electronic component 1 can be reliably realized.

In the fixing structure 10 of the electronic components 1 of the present embodiment, the pair of pressing portions 120 are arranged side by side in the arrangement direction of the electronic components 1, and each pressing portion 120 is provided corresponding to each electronic component 1. Here, since a width of each pressing portion 120 is narrower than a width of the main body portion 11 of each electronic component 1, the fastened portion 112 of the fixing portion 110 between the pair of pressing portions 120 can be provided without unnecessarily widening the distance between the electronic component 1 and the electronic component 1. By fastening and fixing the fastened portion 112 to the base 220 existing at the position separated from the wall surface 211, the fixing member 100 including the pair of pressing portions 120 is mounted to the housing 21 without unnecessarily widening the distance between the electronic component 1 and the electronic component 1.

In the fixing structure 10 of the electronic components 1 of the present embodiment, the pair of grooves 113 and the pair of bosses 221 are arranged side by side in the arrangement direction of the electronic components 1. Accordingly, rotation of the pressing portion 120 around the screw 4 can be limited regardless of a positional relationship of the groove 113 and the boss 221 with respect to the pressing portion 120 and the screw 4.

Figure 6:
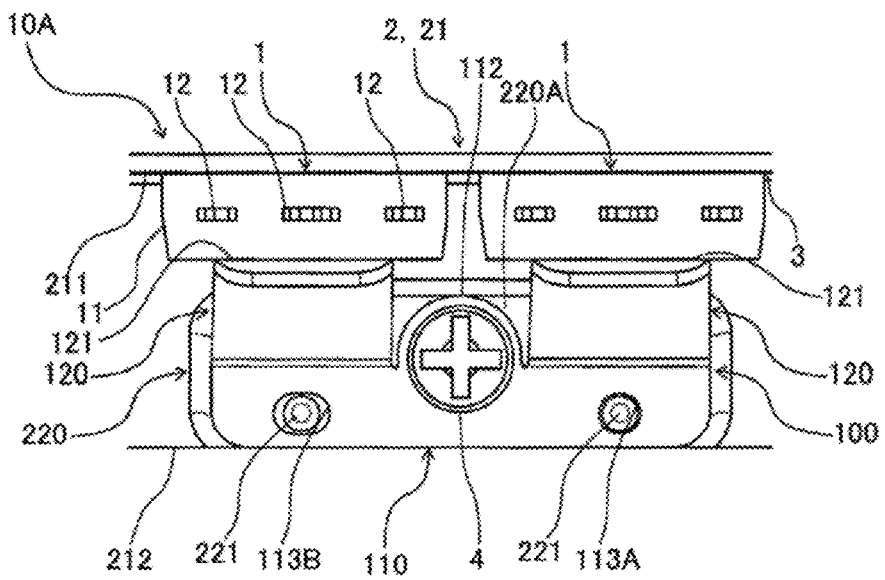
FIG. 6 is a plan view showing a fixing structure of the electronic components according to another embodiment of the present disclosure.

FIG. 6 is a plan view showing a fixing structure 10A of the electronic components 1 according to another embodiment of the present disclosure. As shown in FIG. 6, the fixing structure 10A of the present embodiment includes a round hole 113A and an elongated hole 113B instead of the pair of grooves 113 of the above embodiment. The round hole 113A positions one boss 221 relatively in two directions of the arrangement direction and the pressing direction of the electronic components 1. Meanwhile, the elongated hole 113B positions the other boss 221 relatively in one direction of the pressing direction. Accordingly, the fixing member 100 is positioned in the two directions of the arrangement direction and the pressing direction of the electronic components 1.

Figure 7:
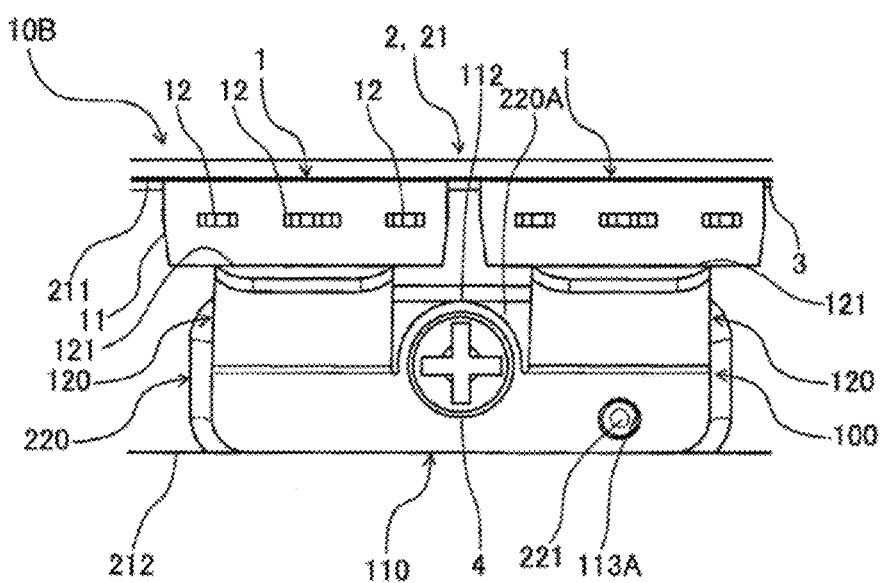
FIG. 7 is a plan view showing a fixing structure of the electronic components according to another embodiment of the present disclosure.

FIG. 7 is a plan view showing a fixing structure 10B of the electronic components 1 according to another embodiment of the present disclosure. As shown in FIG. 7, in the fixing structure 10B of the present embodiment, one boss 221 is provided on one base 220, and one round hole 113A is provided on one fixing portion 110. The round hole 113A positions the boss 221 relatively in the two directions of the arrangement direction and the pressing direction of the electronic components 1.

Here, if the screw 4 is a right-handed screw, a rotational force in a clockwise direction acts on the fixing portion 110 when the screw 4 is tightened, and if the screw 4 is a left-handed screw, a rotational force in a counterclockwise direction acts on the fixing portion 110 when the screw 4 is tightened. Meanwhile, the round hole 113A and the boss 221 limit the rotation of the fixing portion 110 around the screw 4 in the clockwise direction and the counterclockwise direction. Therefore, the rotation of the fixing portion 110 is prevented when the screw 4 is tightened.

Figure 8:
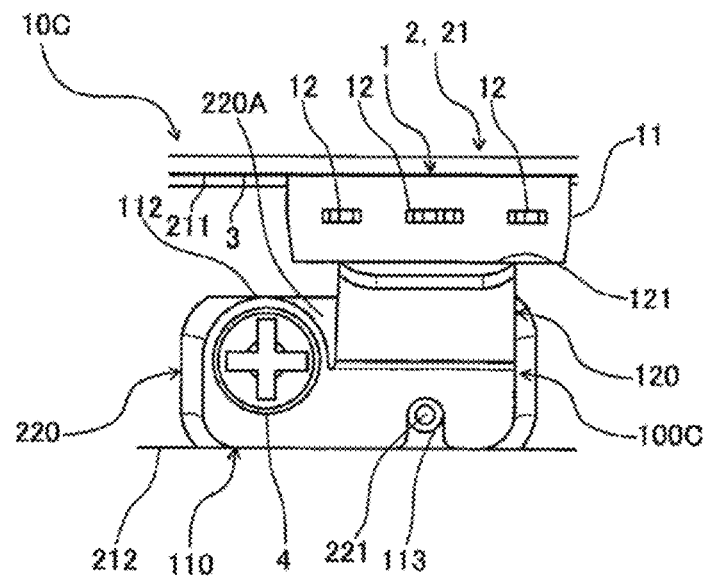
FIG. 8 is a plan view showing a fixing structure of the electronic components according to another embodiment of the present disclosure.

FIG. 8 is a plan view showing a fixing structure 10C of the electronic components 1 according to another embodiment of the present disclosure. As shown in FIG. 8, in the fixing structure 10C of the present embodiment, a fixing member 100C includes one pressing portion 120 and one groove 113, and one boss 221 is provided on one base 220.

Here, the screw 4 is a right-handed screw, and the rotational force in the clockwise direction acts on the fixing portion 110 when the screw 4 is tightened. Meanwhile, the groove 113 and the boss 221 are provided at positions that limit the rotation of the fixing portion 110 around the screw 4 in the clockwise direction. Therefore, the rotation of the fixing portion 110 is prevented when the screw 4 is tightened.

Figure 9:
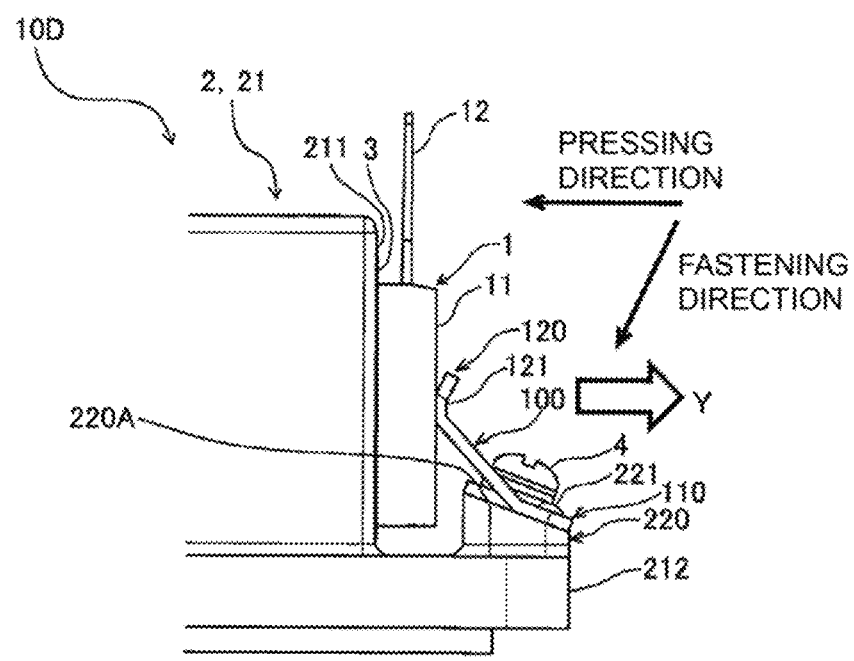
FIG. 9 is a side view showing a fixing structure of the electronic components according to another embodiment of the present disclosure.

FIG. 9 is a side view showing a fixing structure 10D of the electronic components 1 according to another embodiment of the present disclosure. As shown in FIG. 9, in the fixing structure 10D of the present embodiment, the upper surface 220A of the base 220, which is horizontal in the above embodiment, is inclined. Here, the upper surface 220A is inclined such that a height becomes lower as a distance from the electronic component 1 side increases. Accordingly, a posture of the screw 4, which is vertical in the above embodiment, is changed to a posture in which a head is inclined toward a side away from the electronic component 1. Therefore, when the screw 4 is tightened, a fastening tool such as a screwdriver and the electronic component 1 are less likely to interfere with each other, and a workability of a fastening work of the screw 4 is improved.

Although the present disclosure has been described based on the embodiments, the present disclosure is not limited to the embodiments described above. The present disclosure may be modified without departing from the gist of the present disclosure, or known and well-known techniques may be combined as appropriate. For example, in the above embodiments, the boss 221 is provided at the base 220, and the groove 113, the round hole 113A, and the elongated hole 113B are provided in the fixing portion 110, but the boss 221 may be provided at the fixing portion 110, and the groove 113, the round hole 113A, and the elongated hole 113B may be provided in the base 220.

In the above embodiments, the two pressing portions 120 are provided at one fixing member 100, but three or more pressing portions 120 may be provided at one fixing member 100. In this case, one fixing member 100 is provided corresponding to three or more electronic components 1. Further, the number of the grooves 113, the round holes 113A, the elongated holes 113B, and the bosses 221 is not limited to one or two, and may be three or more.

According to a first aspect of the present disclosure, a fixing structure (10, 10A, 10B, 10C, 10D) of an electronic component (1) includes a fixing member (100, 100C) configured to fix at least one electronic component (1) while pressing the at least one electronic component (1) against a wall surface (211) of a housing (21) in a pressing direction, and a fastened portion (220) which is provided at a position away from the wall surface (211) of the housing (21) and to which the fixing member (100, 100C') is fastened and fixed. The fixing member (100, 100C) includes a fixing portion (110) that is fastened and fixed to the fastened portion (220) in a fastening direction that intersects the pressing direction, at least one pressing portion (120) that extends from the fixing portion (110) toward the at least one electronic component (1), the at least one pressing portion (120) being configured to press the at least one electronic component (1) against the wall surface (211) in the pressing direction, and at least one engaging portion (113, 113A, 113B) which is provided at the fixing portion (110). The fastened portion (220) includes at least one engaged portion (221) that is engaged with the at least one engaging portion (113, 113A, 113B), the at least one engaged portion (221) being configured, in cooperation with the at least one engaging portion (113, 113A, 113B), to limit movement of the fixing portion (110) in a direction opposite to the pressing direction.

According to a second aspect of the present disclosure, the at least one electronic component (1) comprises a plurality of electronic components (1) arranged in an arrangement direction, the at least one pressing portion (120) comprises a plurality of pressing portions (120) arranged in the arrangement direction, and the fixing portion (110) is fastened and fixed to the fastened portion (220) between adjacent ones of the plurality of pressing portions (120).

According to a third aspect of the present disclosure, the at least one engaging portion (113, 113A, 113B) comprises a plurality of engaging portions (113, 113A, 113B) arranged in the arrangement direction, and the at least one engaged portion (221) comprises a plurality of engaged portions (221) arranged in the arrangement direction.

According to a fourth aspect of the present disclosure, an in-vehicle charger (2) includes a housing (21), an electronic component (1) that is fixed to a wall surface (211) of the housing (21), a fixing member (100, 100C) that fixes the electronic component (1) while pressing the electronic component (1) against the wall surface (211) in a pressing direction, and a fastened portion (220) which is provided at a position away from the wall surface (211) of the housing (21) and to which the fixing member (100, 100C) is fastened and fixed. The fixing member (100, 100C) includes a fixing portion (110) that is fastened and fixed to the fastened portion (220) in a fastening direction that intersects the pressing direction, a pressing portion (120) that extends from the fixing portion (110) to the electronic component (1) and presses the electronic component (1) against the wall surface (211) in the pressing direction, and an engaging portion (113, 113A, 113B) which is provided at the fixing portion (110). The fastened portion (220) includes an engaged portion (221) that is engaged with the engaging portion (113, 113A, 113B), the engaged portion (221) being configured, in cooperation with the engaging portion (113, 113A, 113B), to limit movement of the fixing portion (110) in a direction opposite to the pressing direction.

According to the present disclosure, the electronic component can be reliably fixed to the wall surface of the housing, and the increase in the dimension of the installation space for the electronic component in the wall surface of the housing can be prevented.

What is claimed is:

1. A fixing structure of an electronic component comprising:
    a fixing member configured to fix at least one electronic component while pressing the at least one electronic component against a wall surface of a housing in a pressing direction; and
    a fastened portion which is provided at a position away from the wall surface of the housing and to which the fixing member is fastened and fixed, wherein
    the fixing member includes:
        a fixing portion that is fastened and fixed to the fastened portion in a fastening direction that intersects the pressing direction;
        at least one pressing portion that extends from the fixing portion toward the at least one electronic component, the at least one pressing portion being configured to press the at least one electronic component against the wall surface in the pressing direction; and
        at least one engaging portion including a pair of grooves which are provided at the fixing portion, and
    the fastened portion includes:
        at least one engaged portion including a pair of bosses corresponding to the pair of grooves that are engaged with the pair of grooves of the at least one engaging portion, the pair of bosses of the at least one engaged portion being configured, in cooperation with the pair of grooves of the at least one engaging portion, to limit movement of the fixing portion in a direction opposite to the pressing direction and limit rotation of the fixing portion about the fastening direction.

2. The fixing structure of the electronic component according to claim 1, wherein
    the at least one electronic component comprises a plurality of electronic components arranged in an arrangement direction,
    the at least one pressing portion comprises a plurality of pressing portions arranged in the arrangement direction, and
    the fixing portion is fastened and fixed to the fastened portion between adjacent ones of the plurality of pressing portions.

3. The fixing structure of the electronic component according to claim 2, wherein
    the at least one engaging portion comprises a plurality of engaging portions arranged in the arrangement direction, and the at least one engaged portion comprises a plurality of engaged portions arranged in the arrangement direction.

4. An in-vehicle charger comprising:
a housing;
an electronic component that is fixed to a wall surface of the housing;
a fixing member that fixes the electronic component while pressing the electronic component against the wall surface in a pressing direction; and
a fastened portion which is provided at a position away from the wall surface of the housing and to which the fixing member is fastened and fixed, wherein
the fixing member includes:
a fixing portion that is fastened and fixed to the fastened portion in a fastening direction that intersects the pressing direction;
a pressing portion that extends from the fixing portion to the electronic component and presses the electronic component against the wall surface in the pressing direction; and
an engaging portion including a pair of grooves which are provided at the fixing portion, and
the fastened portion includes:
an engaged portion including a pair of bosses corresponding to the pair of grooves that are engaged with the pair of grooves of the engaging portion, the pair of bosses of the engaged portion being configured, in cooperation with the pair of grooves of the engaging portion, to limit movement of the fixing portion in a direction opposite to the pressing direction and limit rotation of the fixing portion about the fastening direction.

* * * * *